United States Patent
Wang

(10) Patent No.: US 7,119,390 B2
(45) Date of Patent: Oct. 10, 2006

(54) DYNAMIC RANDOM ACCESS MEMORY AND FABRICATION THEREOF

(75) Inventor: Ting-Shing Wang, Hsinchu Hsien (TW)

(73) Assignee: ProMOS Technologies Inc., Hsinchu (TW)

( * ) Notice: Subject to any disclaimer, the term of this patent is extended or adjusted under 35 U.S.C. 154(b) by 28 days.

(21) Appl. No.: 10/711,939

(22) Filed: Oct. 14, 2004

(65) Prior Publication Data

US 2005/0048711 A1    Mar. 3, 2005

Related U.S. Application Data

(63) Continuation-in-part of application No. 10/605,199, filed on Sep. 15, 2003, which is a continuation-in-part of application No. 10/210,031, filed on Aug. 2, 2002, now Pat. No. 6,875,653.

(51) Int. Cl.
*H01L 27/108* (2006.01)
*H01L 29/76* (2006.01)
*H01L 29/94* (2006.01)
*H01L 31/119* (2006.01)

(52) U.S. Cl. .......................... 257/301; 257/66; 257/305
(58) Field of Classification Search .................. 257/68, 257/71, 301, 304, 305
See application file for complete search history.

(56) References Cited

U.S. PATENT DOCUMENTS 6,608,341 B1 *    8/2003    Schrems .................. 257/301

* cited by examiner

*Primary Examiner*—Phuc T. Dang
(74) *Attorney, Agent, or Firm*—Jianq Chyun IP Office

(57) ABSTRACT

A dynamic random access memory (DRAM) cell is described, including a semiconductor pillar on a substrate, a capacitor on a lower portion of a sidewall of the pillar, and a vertical transistor on an upper portion of the sidewall of the pillar. The capacitor includes a first plate in the lower portion of the sidewall of the pillar, a second plate as an upper electrode at the periphery of the first plate, a third plate at the periphery of the second plate electrically connected with the first plate to form a lower electrode, and a dielectric layer separating the second plate from the first and third plates. A DRAM array based on the DRAM cell and a method for fabricating the DRAM array are also described.

22 Claims, 9 Drawing Sheets

DYNAMIC RANDOM ACCESS MEMORY AND FABRICATION THEREOF

CROSS-REFERENCE TO RELATED APPLICATION

The present application is a continuation in-part (CIP) application of U.S. patent application of Ser. No. 10/605,199 filed Sep. 15, 2003, which is a CIP application of U.S. patent application of Ser. No. 10/210,031 filed Aug. 2, 2002 now U.S. Pat. No. 6,875,653, The entire contents thereof are incorporated herein for reference.

BACKGROUND OF THE INVENTION

1. Field of the Invention

This invention pertains in general to semiconductor devices, and, more particularly, to cell and array structures of dynamic random access memory (DRAM) and processes for manufacturing the DRAM array. The DRAM cell features a capacitor that has a particularly high electrical capacitance.

2. Description of the Related Art

In the semiconductor industry, DRAM is one of the most important integrated circuits, which motivates continuing research and development. There is a continuing effort to increase the storage capacity, improve the writing and reading speed, and decrease the device dimensions of a DRAM cell. A DRAM cell generally includes a transistor and a capacitor operated by the transistor. Conventionally, the design of a DRAM cell can be divided into three types, namely, planar, stacked-capacitor and trench. In the planar design, the transistor and capacitor of a cell are produced as planar components. In the stacked-capacitor design, the capacitor of a cell is disposed above the transistor. In the trench design, the transistor is disposed on the surface of a substrate, and the capacitor is disposed in a trench formed in the substrate.

The process of forming a trench, however, requires an accurate alignment of mask work. For deep sub-micron semiconductor devices, a deep trench may have a length-to-diameter aspect ratio of 40:1. Typically, capacitors are formed in the deep and narrow trenches by depositing a dielectric layer on the trench walls and filling the trench with a doped polysilicon layer. As the aspect ratio becomes higher, for example, exceeds 20:1, the trench becomes more difficult to fill.

SUMMARY OF THE INVENTION

In view of the foregoing, one aspect of this invention is to provide a DRAM cell that has a capacitor formed on the sidewall of a semiconductor pillar to eliminate the trench-filling problem in the prior art and to increase capacitor surface area.

Another aspect of this invention is to provide a DRAM array based on the DRAM cell structure of this invention. The DRAM array can have a higher degree of integration because vertical transistors are formed for the memory cells.

Still another aspect of this invention is to provide a method for fabricating a DRAM array, so as to eliminate the trench-filling problem in the prior art, to increase the capacitance of the capacitor, and to increase the integration of DRAM devices.

The DRAM cell of this invention includes a semiconductor pillar formed on a substrate, a capacitor formed on the lower portion of the sidewall of the pillar, and a vertical transistor formed on the upper portion of the sidewall of the pillar. The capacitor includes a first plate, a second plate, a third plate and a dielectric layer. The first plate is disposed in the lower portion of the sidewall of the pillar, the second plate is disposed at the periphery of the first plate to serve as an upper electrode. The third plate is disposed at the periphery of the second plate, electrically connected with the first plate to form a lower electrode together. The dielectric layer separates the second plate from the first and third plates. The vertical transistor is electrically coupled to the capacitor.

According to an embodiment of this invention, the first plate and the third plate may be electrically connected with each other via a design wherein the first plate further extends to the substrate beside the pillar and the third plate contacts with the substrate beside the pillar. However, the first plate and the third plate may alternatively be electrically connected via other connection design.

The DRAM array of this invention includes rows and columns of the aforementioned memory cells of this invention and multiple bit lines and word lines. The memory cells are disposed on a semiconductor substrate, and have the same structure mentioned above. Each bit line is electrically coupled to the vertical transistors of a row of memory cells, and each word line is electrically coupled to the vertical transistors of a column of memory cells. In addition, the first plates of all capacitors may be connected to each other via a doped surface layer of the substrate between the pillars, so that the first plates and the third plates of all memory cells constitute a common lower electrode.

The method for fabricating a DRAM array of this invention is described as follows. A semiconductor substrate is patterned to form rows and columns of pillars thereon, and then a capacitor is formed on the lower portion of the sidewall of each pillar with the following steps. A first plate as a doped region is formed in the lower portion of the sidewall of each pillar. A first dielectric layer is formed at the periphery of each first plate, and a second plate as an upper electrode is formed at the periphery of each first dielectric layer. A second dielectric layer is formed at the periphery of each second plate, and a third plate is formed at the periphery of each second dielectric layer electrically connected with the corresponding first plate to form a lower electrode. Thereafter, a vertical transistor is formed on the upper portion of the sidewall of each pillar electrically coupled with a corresponding capacitor. Multiple bit lines and word lines are then formed, wherein each bit line is electrically coupled with the vertical transistors of one row of memory cells and each word line with the vertical transistors of one column of memory cells.

Since the capacitor in a DRAM cell of this invention is formed around a semiconductor pillar, but not in a deep trench, the trench-filling problem in the prior art due to the high aspect ratio of deep trenches is thus obviated. Meanwhile, the surface area/capacitance of the capacitor is quite large, because the capacitor can be formed on all sides of the pillar and the second plate as an upper electrode is inserted between the first plate and the third plate to further double the capacitance.

Moreover, since the transistor of a DRAM cell of this invention is formed with a vertical structure, the lateral area occupied by a memory cell can be significantly reduced to remarkably increase the integration of a DRAM array. In other words, the DRAM array of this invention can have a higher degree of integration.

Furthermore, since a capacitor is formed around a semiconductor pillar in the method for fabricating a DRAM array of this invention, the trench-filling problem in the prior art is precluded. Therefore, the quality of the storage capacitors can be improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1–18 illustrate a process flow of fabricating a DRAM array according to a preferred embodiment of this invention, wherein FIGS. 1–7 illustrate the fabrication of the capacitors, FIGS. 8–14 illustrate the fabrication of the vertical transistors, and FIGS. 15–18 illustrate subsequent steps including the fabrications of the bit lines and word lines.

FIGS. 17 and 18 also illustrate a structure of the DRAM cell/array according to the preferred embodiment of this invention.

DESCRIPTION OF THE PREFERRED EMBODIMENTS

Figure 1:
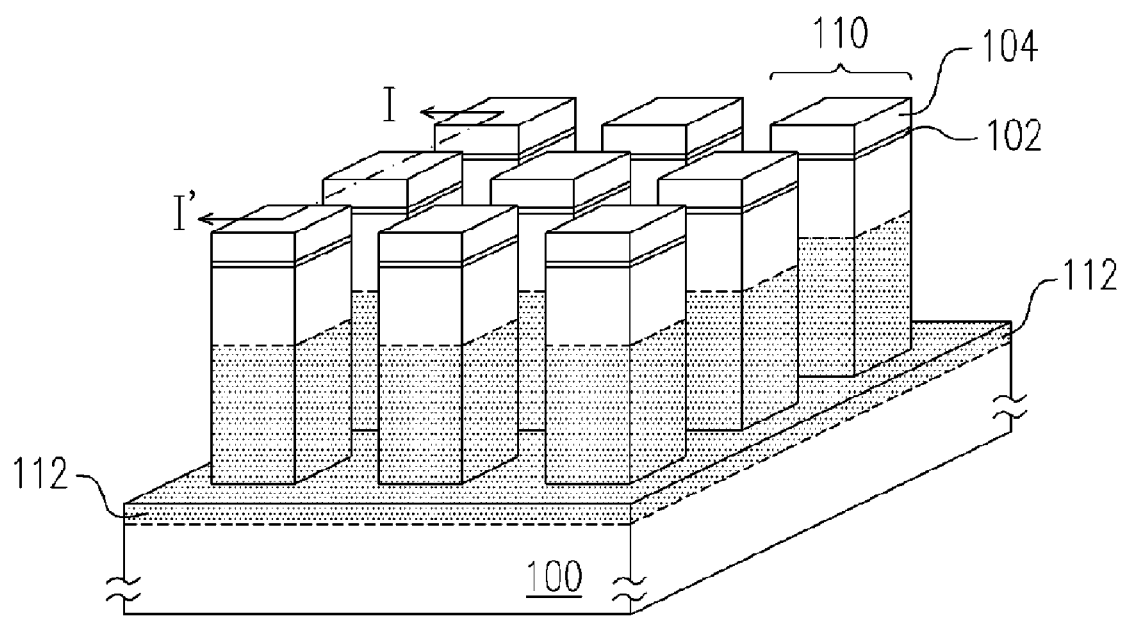
Figure 11:
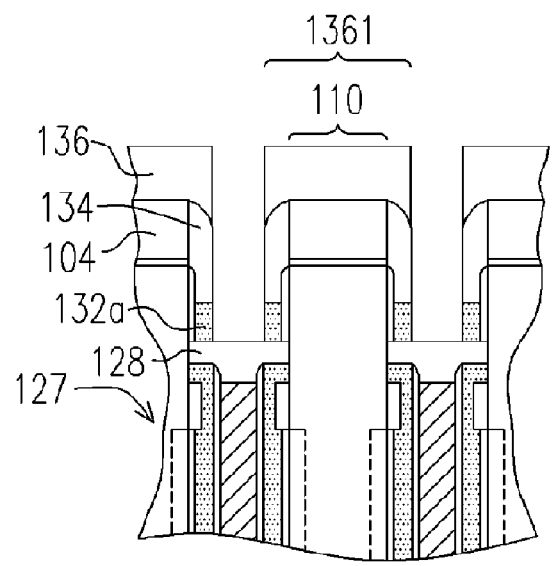
Figure 12:
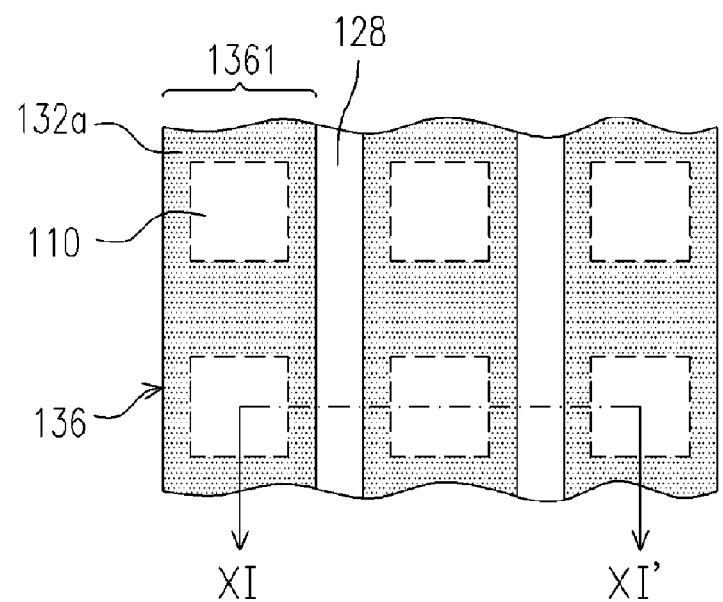
Figure 15:
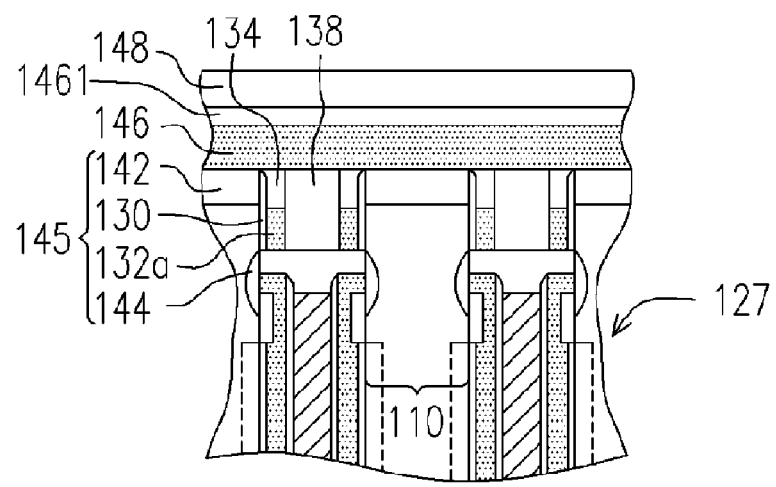
Figure 16:
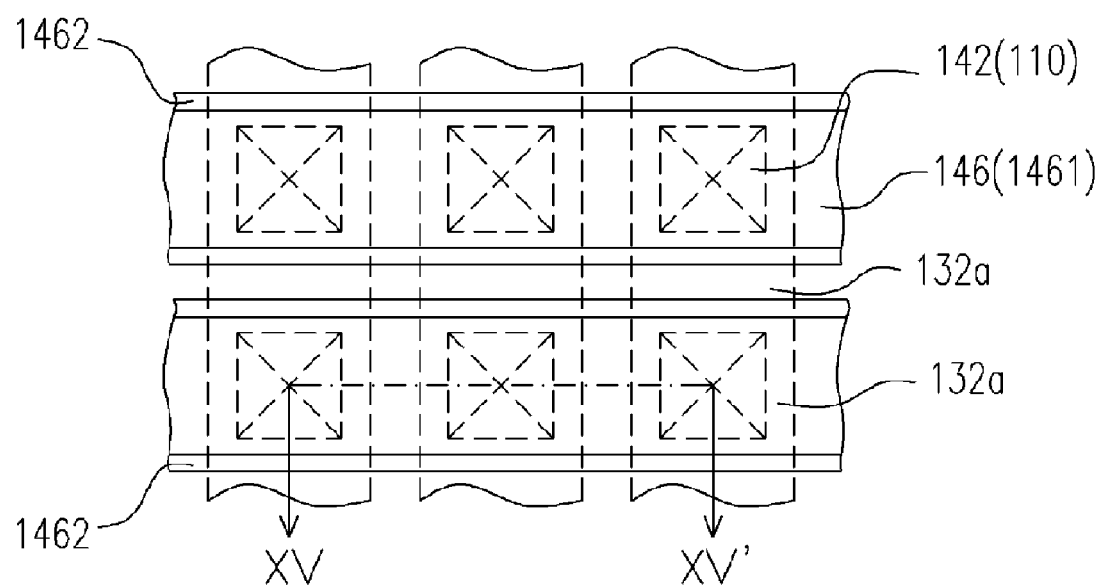
Figure 17:
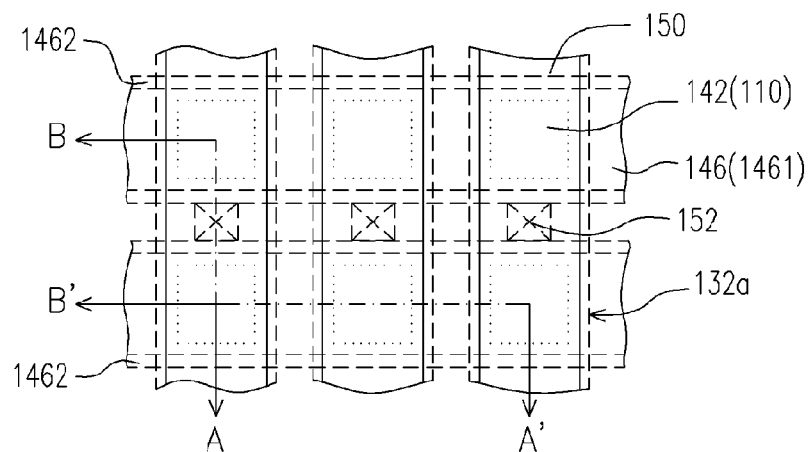

FIG. 1 clearly shows the DRAM array arrangement in a perspective view, FIGS. 2–11, 13–15 and 18(a) are cross-sectional views along line I–I' in FIG. 1, FIG. 18(b) is another cross-sectional view, and FIGS. 12, 16 and 17 are top views.

More specifically, FIGS. 1–7 illustrate the process flow of forming the capacitors of the DRAM array, FIGS. 8–14 illustrate the process flow of forming the transistors of the DRAM array, and FIGS. 15–18 illustrate subsequent steps including the fabrications of the bit lines and the word lines.

<Fabrication of Capacitors>

Referring to FIG. 1, a semiconductor substrate 100, such as a P--doped single-crystal silicon substrate, is provided, and then a pad oxide layer 102 and a patterned mask layer 104 are formed on the substrate 100. The patterned mask layer 104 includes rows and columns of rectangular or square blocks, and is formed from an etching-resistant material like silicon nitride (SiN). The substrate 100 is etched with the patterned mask layer 104 as a mask to form rows and columns of semiconductor pillars 110. It is noted that each block of the patterned mask layer 104 may alternatively have a round shape, an elliptical shape or another polygonal shape in top view, even though the top view of the patterned mask layer 104 as shown in the figure has a rectangular or square shape. In the alternative case, of course, a pillar 110 is shaped as a cylinder, an elliptical cylinder, or a corresponding polygonal pillar.

Moreover, it is particularly noted that a semiconductor pillar 110 and the portion of the mask layer 104 thereon together are sometimes referred to as a pillar 110 in the descriptions of the specification hereinafter for convenience.

Referring to FIG. 1 again, a doped region 112 as a portion of the common lower electrode of the storage capacitors formed later is formed in the lower portion of the sidewall of each pillar 110 and in the surface layer of the substrate 100. The portion of the doped region 112 in each pillar 110 serves as a first plate of a capacitor that is described in the Summary of the invention. Meanwhile, the portion of the doped region 112 in the substrate 100 between the pillars 110 is the doped surface layer of the substrate between the pillars that is described In the Summary.

The doping method includes the following steps, for example. An arsenic-doped silicon oxide layer (not shown) is formed between the pillars 110, having a predetermined depth. The arsenic-doped silicon oxide layer can be formed by, for example, depositing silicon oxide with in-situ arsenic doping over the substrate 100 to fill the spaces between the pillars 110 and etching back the arsenic-doped silicon oxide until its depth is increased to the predetermined one. Alternatively, the arsenic-doped oxide layer is formed covering the lower portion of pillar sidewall through photoresist coating and etching back process to define the predetermined depth. After the arsenic-doped oxide layer is covered with an undoped oxide layer, a thermal process is performed to thermally driving some arsenic atoms from the arsenic-doped oxide layer into the contacting surface layers of the semiconductor pillars 110 and the surface layer of the bottom substrate 100. Afterward, the arsenic-doped oxide layer and the undoped oxide layer are removed.

The subsequent steps for completing the fabrication of the capacitors are illustrated in FIGS. 2–7, which are cross-sectional views along line I–I'.

Figure 2:
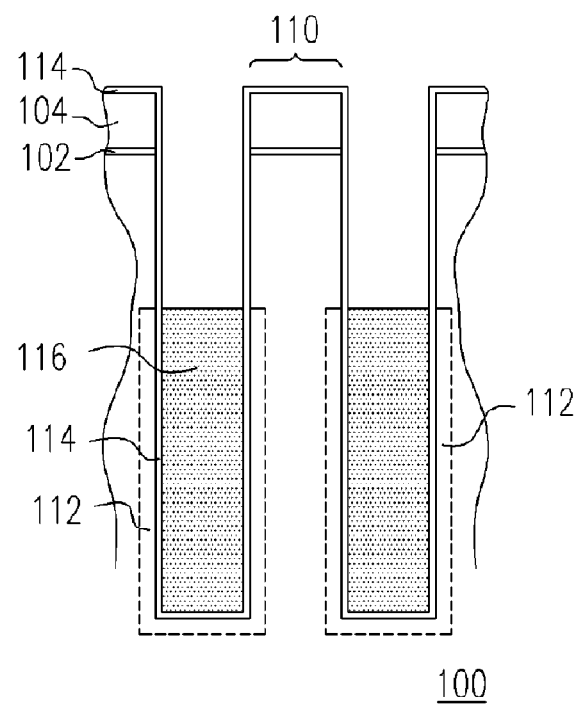

Referring to FIG. 2, a conformal dielectric layer 114 is formed on the substrate 100 and the pillars 110. The conformal dielectric layer 114 is preferably an oxide/nitride/oxide (ONO) or nitride/oxide (NO) composite layer as a capacitor dielectric layer. A conductive layer 116 is then formed between the pillars 110 having a top depth approximately the same as or lower than that of the doped region 112. The conductive layer 116 is formed from a conductive material like N+-doped poly-Si, and can be formed by, for example, depositing poly-Si with in-situ doping over the substrate 100 to fill the space between the pillars 110 and then etching back the poly-Si to a predetermined depth.

Figure 3:
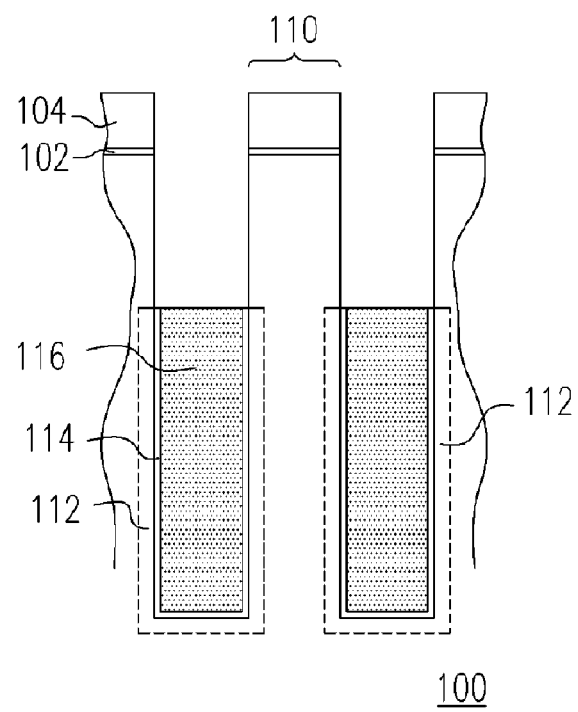

Referring to FIG. 3, the exposed portion of the dielectric layer 114 is removed, possibly through a wet-etching process. When the dielectric layer 114 is an ONO composite layer comprising a top oxide layer, a nitride layer and a bottom oxide layer, for example, dilute hydrofluoric acid, phosphoric acid and dilute hydrofluoric acid can be used in sequence to remove the exposed top oxide layer, the exposed nitride layer and the exposed bottom oxide layer, respectively.

Figure 4:
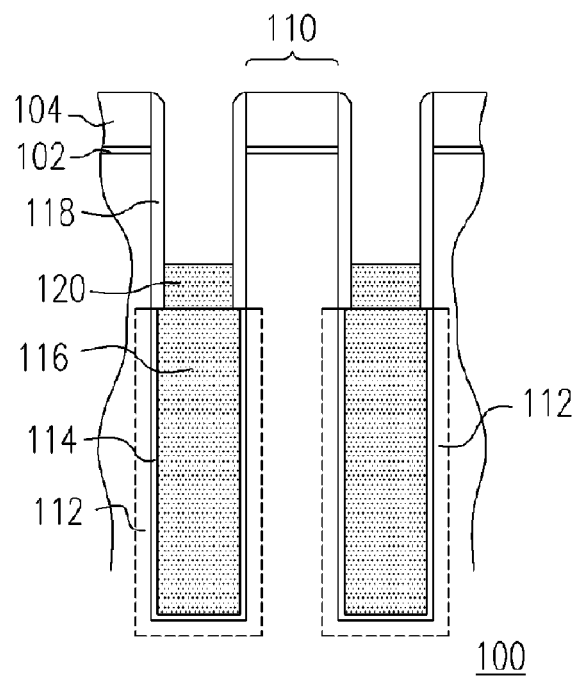

Referring to FIG. 4, an insulating spacer 118 is formed on the sidewall of each pillar 110 above the conductive layer 116. The insulating spacer 118 includes a dielectric material like silicon oxide, and is formed with, for example, chemical vapor deposition (CVD) and subsequent anisotropic etching. It is noted that though the insulating spacer 118 is shown to form on two sides of the corresponding pillar 110 in the cross-sectional view, it actually surrounds the pillar 110. A conductive layer 120 is then formed between the pillars overlying the conductive layer 116 and covering a lower portion of each insulating spacer 118. The conductive layer 120 includes a conductive material like N+-doped polysilicon, and can be formed by, for example, depositing poly-Si over the substrate 100 with in-situ doping and etching back the poly-Si to a predetermined depth.

Figure 5:
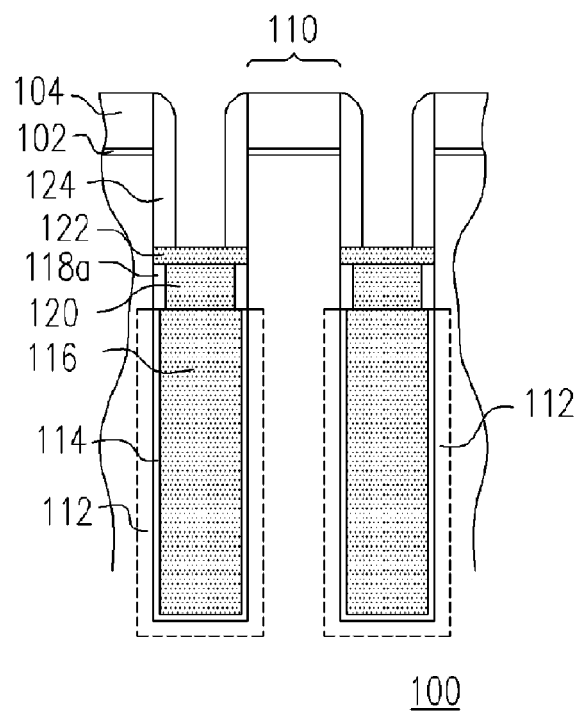

Referring to FIG. 5, the exposed portion of the insulating spacer 118 on each pillar 110 is removed to form a collar insulating layer 118a surrounding the pillar 110. Another conductive layer 122 is formed between the pillars 110 overlying the collar insulating layer 118a and the conductive layer 120. The conductive layer 122 is formed from a conductive material like N+-doped polysilicon, and can be formed using the same depositing/etching-back method mentioned above. Thereafter, a mask spacer 124 is formed on the sidewall of each pillar 110 above the conductive layer 122, having a thickness larger than that of the collar insulating layer 118a. The mask spacer 124 is for defining an upper electrode of a capacitor, as described below.

Figure 6:
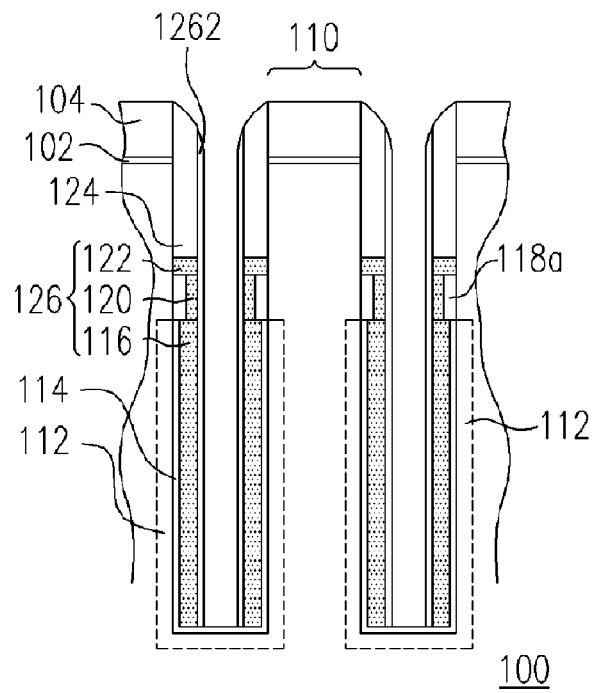

Referring to FIGS. 5 and 6 simultaneously, the three conductive layers 122, 120 and 116 are sequentially etched using the mask spacers 124 as a mask to form an upper electrode 126 on the lower sidewall of each pillar 110. It is noted that the remaining conductive layer 122, i.e., the top portion of the upper electrode 126, directly contacts with the sidewall of the semiconductor pillar 110. Thereafter, a dielectric spacer 1262 is formed on the sidewall of the mask spacer 124 and the three conductive layers 122, 120 and 116. The dielectric spacer may be a SiN/SiO (NO) composite spacer, which may be formed by sequentially forming a nitride layer and an oxide layer and then performing anisotropic etching to remove a portion of the nitride layer and the oxide layer.

Figure 7:
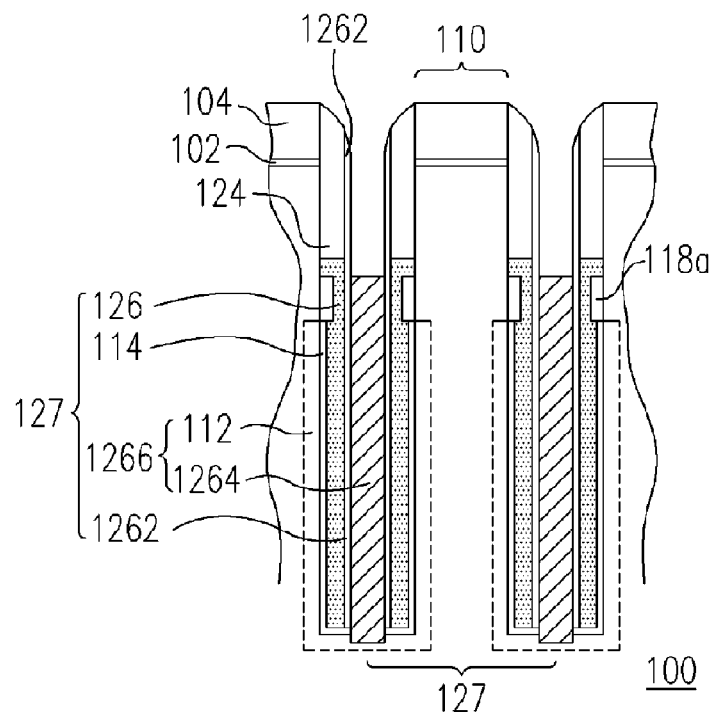

Referring to FIG. 7, the exposed dielectric layer 114 is removed, and then a conductive layer 1264 is formed partially filling the inter-pillar space and contacting with the portion of the doped region 112 in the inter-pillar substrate 100. Thereby, the whole doped region 112 and the conductive layer 1264 together constitute a common lower electrode 1266. Meanwhile, the portion of the doped region 112 and the portion of the conductive layer 1264 corresponding to one pillar 110 serve as a first plate and a third plate, respectively, that are described in the Summary.

The conductive layer 1264 can be formed by, for example, forming a conductive material (not shown) filling up the inter-pillar space and then recessing the conductive material to a predetermined depth, and the material of the same may be doped poly-Si. The upper electrode 126, the dielectric layers 114 and 1262 and the common lower electrode 1266 together constitute a capacitor 127. Since a capacitor 127 is formed on all sidewalls of a pillar 110 and the upper electrode 126 is inserted between the doped region 112 and the conductive layer 1264 as two parts of the lower electrode 1266, the capacitance of the capacitor 127 is quite large.

Moreover, in the above method for forming a capacitor around each pillar, some modifications or variations on, for example, the material and the fabrication method of each layer and the fabrication sequence of the layers, are also possible within the scope of this invention.

<Fabrication of Transistors>
<Fabrication of Gate Structures>

Figure 8:
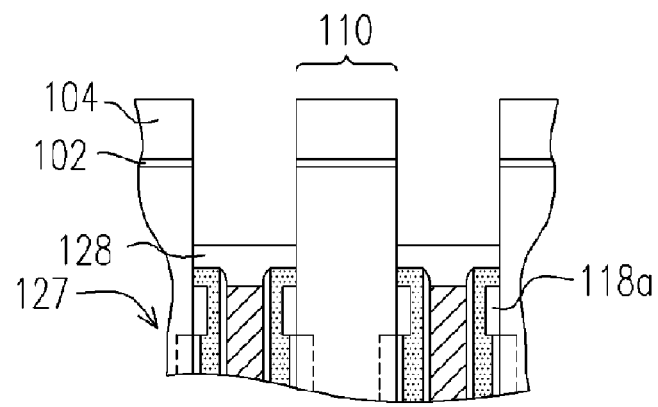

Referring to FIG. 8, the mask spacers 124 and the upper portion of the dielectric layer 1262 are removed, and then an insulating layer 128 is filled between the pillars 110 to cover all capacitors 127. The insulating layer 128 includes a dielectric material like SiO, and can be formed by, for example, depositing SiO over the substrate 100 and then etching back the same to a predetermined depth. Thereafter, a gate insulating layer 130 is formed on the exposed sidewall of each semiconductor pillar 110. The gate insulating layer 130 is, for example, a thin silicon oxide layer or a thin oxide/nitride layer, and may be formed with a thermal oxidation process or a thermal oxidation-nitridation process.

Figure 9:
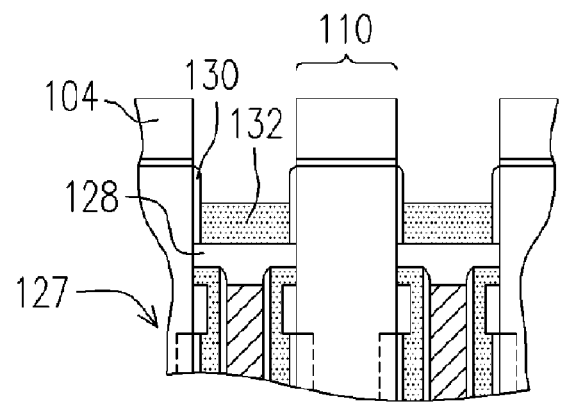

Referring to FIG. 9, a conductive layer 132 is then formed between the pillars 110 overlying the insulating layer 128 and covering the lower portion of the gate insulating layer 130. The conductive layer 132 is composed of a conductive material like N+-doped poly-Si, and can be formed by, for example, depositing poly-Si over the substrate 100 with in-situ N-doping and etching back the poly-Si to a predetermined depth.

Figure 10:
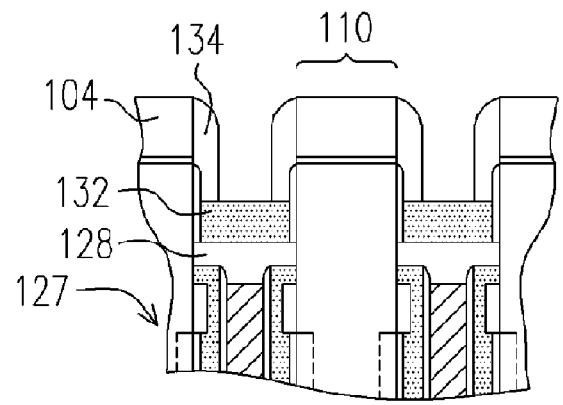

Referring to FIG. 10, a mask spacer 134 is formed on the sidewall of each pillar 110 above the conductive layer 132. The mask spacer 134 is for defining a gate later, and is formed from an insulating material, such as, silicon oxide.

Refer to FIGS. 11–12, wherein FIG. 12 is a top view of the resulting structure after the following steps, and FIG. 11 is a cross-sectional view of the same along line XI–XI'. A patterned mask layer 136, such as, a patterned photoresist layer, is formed over the substrate 100. The patterned mask layer 136 includes parallel linear patterns 1361, wherein each linear pattern 1361 covers the pillars 110 in one column and the conductive layer 132 between the pillars 110 of the same column. The conductive layer 132 is then etched using the mask spacers 134 and the patterned mask layer 136 as a mask to form a gate 132a on the sidewall of each pillar 110. A mask spacer 134 ensures the corresponding gate 132a to surround the corresponding pillar 110 even if misalignments of the patterned mask layer 136 occurs.

The gates 132a on the sidewalls of the pillars 110 in one column are connected via the remaining conductive layer 132a between the pillars 110 of the same column to be a gate line 132a (dotted region), which can directly serve as a word line. However, another low-resistance conductive line can be further formed overlying and electrically connecting with the gate line 132a to reduce the resistance, as described later.

Moreover, in the above method for forming a gate structure around each pillar, some modifications or variations on, for example, the material and the fabrication method of each layer and the fabrication sequence of the layers, are also possible within the scope of this invention.

<Fabrication of Source/Drain>

Figure 13:
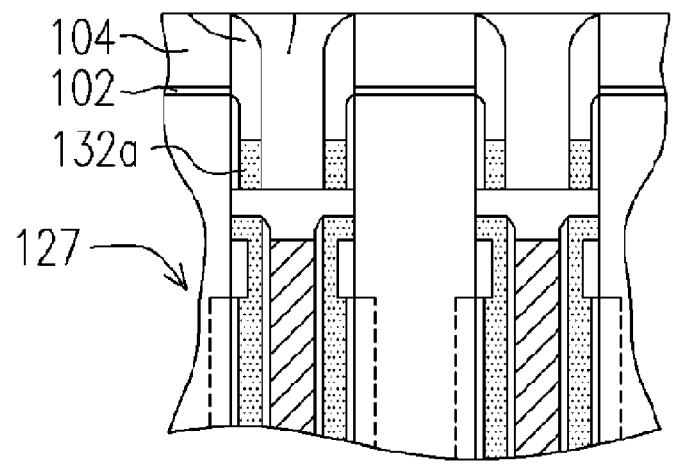

Referring to FIG. 13, the spaces between the pillars 110 are filled up with an insulating layer 138, which is formed from an insulating material like silicon oxide and is formed by, for example, performing plasma-enhanced CVD (PECVD) and chemical mechanical polishing (CMP) in sequence.

Figure 14:
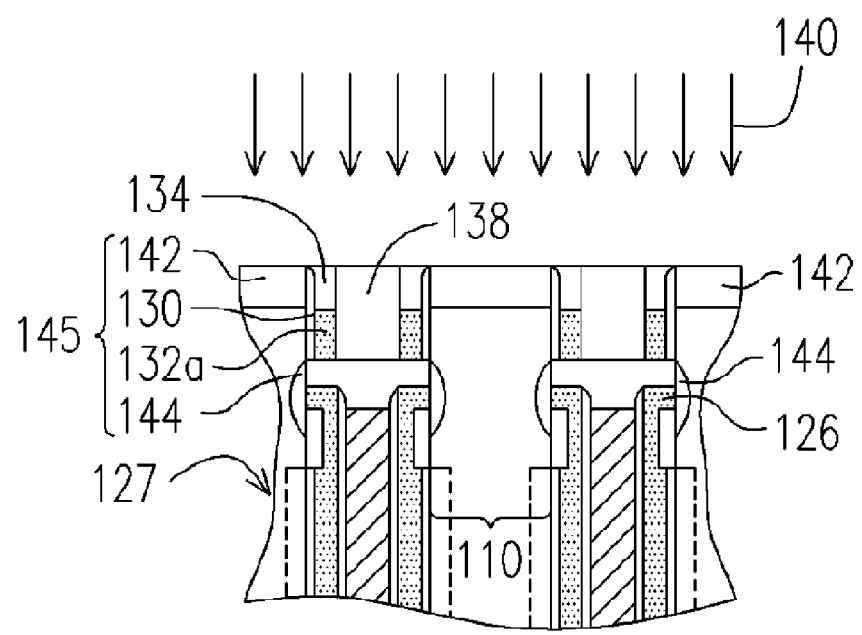

Referring to FIG. 14, the patterned mask layer 104, the pad oxide layer 102, a portion of the mask spacers 134 and a portion of the insulating layer 138 are removed. The four parts may be removed by performing a chemical mechanical polishing (CMP) process, for example, so that the top surfaces of the mask spacers 134 and the insulating layer 138 are substantially coplanar with those of the semiconductor pillars 110. An ion implantation 140 is then conducted to form a doped region 142 in the top portion of each semiconductor pillar 110 to serve as a source/drain region. The doped region 142 may be an N+-doped region implanted with phosphorous ions or arsenic ions.

A high-temperature annealing process is then performed to repair the damaged lattices in the semiconductor pillars 110 caused by the implantation 140, and to drive some dopants from the upper electrode 126 into the sidewall of each semiconductor pillar 110 to form a doped region 144. The doped regions 142 and 144, the gate 132a and the gate insulating layer 130 together form a vertical transistor 145. It is noted that though the doped region 144 is not illustrated in previous figures, the doped region 144 actually grows more or less during every thermal process after the top portion 122 of the upper electrode 126 is formed (FIG. 5). However, in the preferred embodiment, the doped region 144 grows mainly during the high-temperature annealing process after the doped regions 142 are formed.

<Fabrication of Bit Lines and Word Lines>

FIGS. 15–16 illustrate the step of forming the bit lines of the memory array, wherein FIG. 16 is a top view of the resulting structure after the following steps and FIG. 15 a cross-sectional view of the same along line XV–XV'. After the fabrication of the vertical transistor 145 is completed, multiple bit lines 146 are formed over the substrate 100. Each bit line 146 directly contacts with the doped regions 142 in the top portions of the pillars 110 in one row. The bit lines 146 are formed from a conductive material like N+-doped poly-Si, and can be formed by using a deposition-patterning method or a damascene method.

In addition, a cap layer 1461 can be disposed on each bit line 146, and a protective spacer 1462 can be formed on the sidewalls of each pair of bit line 146 and cap layer 1461 if the bit lines 146 and the cap layers 1461 are formed with a deposition-patterning procedure. The cap layers 1461 and the protective spacers 1462, which are preferably constituted of silicon nitride, are formed to prevent the bit lines 146 from being exposed during the subsequent contact hole etching process, so that the contact holes will be formed in a self-aligned manner. Thereafter, an insulating layer 148 is formed over the substrate 100 covering the bit lines 146 and filling up the gap between every two bit lines 146 to isolate the bit lines 146 from the word lines that will be formed in the next step.

Figure 18:
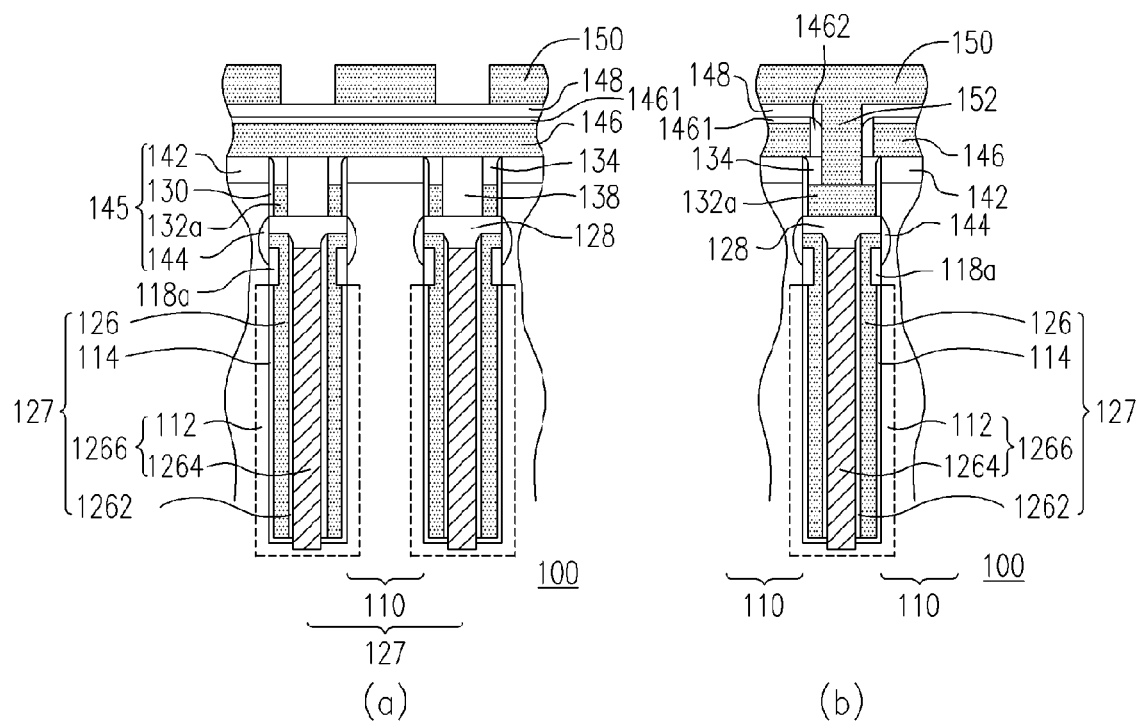

FIGS. 17–18(a)/(b) illustrate the step of forming additional word lines of the memory array to electrically connect with the gate lines formed previously. FIG. 17 is a top view of the resulting structure after the following steps, and FIGS. 18(a) and 18(b) cross-sectional views of the same along line A–A' and line B–B', respectively. After the insulating layer 148 is formed, multiple word lines 150 are formed over the substrate 100. Each word line 150 is electrically connected to the gates 132a on the sidewalls of the pillars 110 in one column via at least one contact 152 between two pillars 110. The contact 152 directly contacts with the conductive layer 132a connecting between two gates 132a on the sidewalls of two adjacent pillars 110 in the same column.

The contact 152 and the word line 150 are formed by, for example, forming a contact hole in the insulating layer 148 exposing a portion of the conductive layer 132a, depositing a conductive layer covering the insulating layer 148 and filling up the contact hole, and then patterning the conductive layer. Alternatively, the contact 152 and the word line 150 can be formed with a damascene process.

FIGS. 17 and 18(a)/(b) also illustrate a structure of the DRAM cell/array according to the preferred embodiment of this invention. The structure of the DRAM cell/array can be understood according to the above descriptions of the preferred embodiment.

Referring to FIGS. 17 and 18(a)/(b), since the capacitor 127 in a DRAM cell of this invention is formed around a semiconductor pillar 110, but not in a deep trench, the trench-filling problem in the prior art caused by high aspect ratios of deep trenches does not exist. Meanwhile, the surface area/capacitance of the capacitor 127 is quite large, because the capacitor 127 can be formed on all sides of the pillar and the upper electrode 126 is inserted between the two parts 112 and 1264 of the lower electrode 1266 to further double the capacitance.

Moreover, since the transistor 145 of a DRAM cell of this invention is formed with a vertical structure, the size of each memory cell can be significantly reduced to remarkably increase the integration of the memory array.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A dynamic random access memory (DRAM) cell, comprising:
    a semiconductor pillar on a substrate;
    a capacitor on a lower portion of a sidewall of the pillar, comprising:
        a first plate in the lower portion of the sidewall of the pillar;
        a second plate as an upper electrode at periphery of the first plate;
        a third plate at periphery of the second plate, electrically connecting wit the first plate to form a lower electrode together; and
        a dielectric layer, separating the second plate from the first plate and the third plate; and
    a vertical transistor on an upper portion of the sidewall of the pillar, electrically coupled with the capacitor.

2. The DRAM cell of claim 1, wherein
    the first plate and the third plate are electrically connected via a design wherein the first plate further extends to the substrate beside the pillar and the third plate contacts with the substrate beside the pillar; and
    the dielectric layer is also disposed on a portion of the first plate in the substrate beside the pillar to separate a bottom of the second plate from the first plate.

3. The DRAM cell of claim 2, wherein the dielectric layer comprises:
    a first dielectric layer between the pillar and the second plate and between the substrate and the second plate; and
    a second dielectric layer between the second plate and the third plate, connecting with the first dielectric layer.

4. The DRAM cell of claim 1, wherein the second plate has a top portion directly contacting with a source/drain region of the vertical transistor in the pillar.

5. The DRAM cell of claim 1, wherein the first plate, the second plate, the third plate and the dielectric layer surround the pillar.

6. The DRAM cell of claim 5, wherein the capacitor further comprises:
    a collar insulating layer surrounding the pillar and covered by an upper portion of the second plate.

7. The DRAM cell of claim 6, wherein the second plate comprises:
    a first conductor surrounding the collar insulating layer;
    a second conductor under the first conductor and the collar insulating layer; and
    a third conductor on the first conductor and the collar insulating layer, electrically coupled with the vertical transistor.

8. The DRAM cell of claim 1, wherein the vertical transistor comprises,
    a first doped region in the sidewall of the pillar, electrically connected with the upper electrode of the capacitor;
    a second doped region in a top portion of the pillar;
    a gate on the sidewall of the pillar between the first doped region and the second doped region; and
    a gate insulating layer between the sidewall of the pillar and the gate.

9. The DRAM cell of claim 8, wherein the gate is separated from a top portion of the upper electrode by an insulator.

10. The DRAM cell of claim 8, wherein the first doped region, the gate and the gate insulating layer surround the pillar.

11. A dynamic random access memory (DRAM) array, comprising:
    rows and columns of memory cells disposed on a substrate, each comprising:
        a semiconductor pillar on the substrate;
        a capacitor on a lower portion of a sidewall of the pillar, comprising a first plate in the lower portion of the sidewall of the pillar, a second plate as an upper electrode at periphery of the first plate, a third plate disposed at periphery of the second plate and electrically connected with the first plate to form a lower electrode together and a dielectric layer separating the second plate from the first plate and the third plate; and
        a vertical transistor on an upper portion of the sidewall of the pillar, electrically coupled with the capacitor;
    a plurality of bit lines, each coupled with one row of vertical transistors; and
    a plurality of word lines, each coupled with one column of vertical transistors.

12. The DRAM array of claim 11, wherein
    the first plates are electrically connected with each other via a doped surface layer of the substrate between the pillars;
    the third plates together constitute a conductive layer partially filling the space between the pillars and contacting with the doped surface layer of the substrate; and
    the first plates, the doped surface layer and the conductive layer together serve as a common lower electrode.

13. The DRAM array of claim 12, wherein in each memory cell, the dielectric layer comprises:
    a first dielectric layer between the second plate and the pillar and between the second plate and the doped surface layer of the substrate; and
    a second dielectric layer between the second plate and the third plate, connecting with the first dielectric layer.

14. The DRAM array of claim 11, wherein each second plate has a top portion directly contacting with a source/drain region of a corresponding vertical transistor.

15. The DRAM array of claim 11, wherein in each capacitor, the first plate, the second plate, the dielectric layer and the third plate surround the pillar.

16. The DRAM array of claim 15, wherein each capacitor further comprises a collar insulating layer that surrounds the corresponding pillar and is covered by an upper portion of the second plate.

17. The DRAM array of claim 16, wherein the second plate comprises:
    a first conductor surrounding the collar insulating layer;
    a second conductor under the first conductor and the collar insulating layer; and
    a third conductor on the first conductor and the collar insulating layer, electrically coupled with a corresponding vertical transistor.

18. The DRAM array of claim 11, wherein each vertical transistor comprises:
    a first doped region in the sidewall of a corresponding pillar, electrically connected with the upper electrode of a corresponding capacitor;
    a second doped region in a top portion of the pillar;
    a gate on the sidewall of the pillar between the first doped region and the second doped region; and
    a gate insulating layer between the sidewall of the pillar and the gate.

19. The DRAM array of claim 18, wherein each bit line directly contacts with the second doped regions of the vertical transistors of the memory cells in one row.

20. The DRAM array of claim 18, wherein the gates of the memory cells in one column are connected to each other to form a gate line.

21. The DRAM array of claim 20, Wherein the gate line directly serves as a word line for the vertical transistors in the column.

22. The DRAM ray of claim 20, wherein a word line is electrically connected to the gate line via at least one contact between two pillars.

* * * * *